United States Patent
Ok

(10) Patent No.: US 8,502,577 B2
(45) Date of Patent: Aug. 6, 2013

(54) PHASE CORRECTION CIRCUIT, DATA ALIGNMENT CIRCUIT AND METHOD OF ALIGNING DATA USING THE SAME

(75) Inventor: Sung Hwa Ok, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/970,913

(22) Filed: Dec. 16, 2010

(65) Prior Publication Data

US 2011/0291719 A1    Dec. 1, 2011

(30) Foreign Application Priority Data

May 31, 2010    (KR) .................. 10-2010-0051365

(51) Int. Cl.
*H03L 7/06*    (2006.01)
(52) U.S. Cl.
USPC ........................................ 327/158; 327/149
(58) Field of Classification Search
None
See application file for complete search history.

(56) References Cited

U.S. PATENT DOCUMENTS

| | | | | |
|---|---|---|---|---|
| 7,234,069 B1 * | 6/2007 | Johnson | ...................... | 713/400 |
| 7,327,173 B2 * | 2/2008 | Kim | .................. | 327/149 |
| 7,450,443 B2 * | 11/2008 | Cheng | ........................ | 365/193 |
| 7,499,343 B2 * | 3/2009 | Kang | ..................... | 365/189.05 |
| 7,889,581 B2 * | 2/2011 | Wakasa | ........................ | 365/194 |
| 7,940,103 B2 * | 5/2011 | Satoh et al. | ................... | 327/175 |
| 2003/0086303 A1 | 5/2003 | Jeong | | |
| 2004/0113667 A1 * | 6/2004 | Jin | ................ | 327/158 |
| 2006/0140022 A1 * | 6/2006 | Lee | .............................. | 365/193 |
| 2007/0257717 A1 * | 11/2007 | Yoon | ............................ | 327/153 |
| 2008/0189568 A1 * | 8/2008 | Kwak | ........................ | 713/501 |
| 2008/0232178 A1 * | 9/2008 | Aoki | ........................... | 365/193 |
| 2009/0161453 A1 * | 6/2009 | Giovannini et al. | .......... | 365/193 |
| 2009/0296503 A1 * | 12/2009 | Chu et al. | ..................... | 365/193 |
| 2010/0014377 A1 * | 1/2010 | Ma | ............................ | 365/233.1 |
| 2010/0090737 A1 | 4/2010 | Watanabe et al. | | |
| 2010/0118626 A1 * | 5/2010 | Maeda | ......................... | 365/193 |

FOREIGN PATENT DOCUMENTS

| | | |
|---|---|---|
| JP | 200612363 A | 1/2006 |
| JP | 2010-141703 | 6/2010 |
| KR | 1020090067797 A | 6/2009 |
| KR | 10-0936797 B1 | 1/2010 |
| KR | 1020100056407 A | 5/2010 |

* cited by examiner

*Primary Examiner* — Cassandra Cox
(74) *Attorney, Agent, or Firm* — William Park & Associates Patent Ltd.

(57) ABSTRACT

Various exemplary embodiments of a phase correction circuit are disclosed. In one exemplary embodiment, the phase correction circuit may include a delay unit configured to delay a clock signal by a predetermined delay time and generate a delay clock signal, a delay line configured to delay a data strobe signal by a variable delay time in response to a delay control signal and generate a corrected data strobe signal, a phase detector configured to detect a phase difference between the delay clock signal and the corrected data strobe signal and generate a phase detection signal, and a shift register configured to generate the delay control signal in response to the phase detection signal.

18 Claims, 3 Drawing Sheets

PHASE CORRECTION CIRCUIT, DATA ALIGNMENT CIRCUIT AND METHOD OF ALIGNING DATA USING THE SAME

CROSS-REFERENCE TO RELATED APPLICATION

The present application claims priority under 35 U.S.C. §119(a) to Korean Application No. 10-2010-0051365, filed on May 31, 2010, in the Korean Intellectual Property Office, which is incorporated herein by reference in its entirety as if set forth in full.

BACKGROUND

1. Technical Field

Various embodiments of the present invention relate to a semiconductor circuit and, more particularly, to a phase correction circuit, a data alignment circuit and method of aligning data using the is same.

2. Related Art

A semiconductor circuit, such as a memory, performs a write operation for aligning and recording data provided from outside according to a data strobe signal DQS.

A tDQSS is a specification value that defines a time difference between a clock signal and a data strobe signal. Even though a memory controller outputs two signals by setting a tDQSS to '0', the tDQSS between the clock signal and the data strobe signal inputted to a memory can have a value other than '0' due to a "skew" occurring at a board level.

Since the tDQSS is defined on the basis of a clock signal period (tCK), it becomes more difficult to satisfy the tDQSS specification as the operation speed (e.g., frequency of the clock signal) of the memory increases. In this regard, a memory such as a DDR3 provides a function called "write leveling" to satisfy the tDQSS specification in an input pad. At this time, the tDQSS specification needs to satisfy ±0.25*tCK.

The write leveling is performed as follows. The memory controller outputs the clock signal and the data strobe signal to the memory. The memory samples the clock signal at the rising edge of the data strobe signal. The memory feeds the sampling results back to the memory controller through a DQ pad. The memory controller adjusts the delay of the data strobe signal until the value of the sampling result becomes '1' and then completes the write leveling.

While the memory is affected by a variation in PVT (process, voltage or temperature) in a normal operation, the write leveling is performed only in the initial step before the memory performs the normal operation. Therefore, there is no method capable of compensating for the skew of the clock signal and the data strobe signal, which occurs in the normal operation of the memory.

SUMMARY

Accordingly, there is a need for an improved semiconductor circuit that may obviate one or more of the above-mentioned problems or disadvantages. In particular, there is a need for a phase correction circuit capable of tracing the skew of a clock signal and a data strobe signal during a normal operation and compensating the skew in real-time.

In the following description, certain aspects and embodiments will become evident. It should be understood that these aspects and embodiments are merely exemplary, and the invention, in its broadest sense, could be practiced without having one or more features of these aspects and embodiments.

To attain the advantages and in accordance with the purpose of the invention, as embodied and broadly described herein, one aspect of the invention may provide a data alignment circuit comprising: a phase correction circuit configured to detect a phase difference between a clock signal and a data strobe signal, adjust a delay time of the data strobe signal based on the detected phase difference, and generate a corrected data strobe signal; a delay line configured to delay data by a time substantially equal to the delay time of the data strobe signal and generate corrected data; and a data alignment latch configured to latch the corrected data in response to the corrected data strobe signal.

In another exemplary aspect, a phase correction circuit may comprise: a delay unit configured to delay a clock signal by a predetermined delay time and generate a delay clock signal; a delay line configured to delay a data strobe signal (e.g., for a data write operation) by a variable delay time in response to a delay control signal and generate a corrected data strobe signal; a phase detector configured to detect a phase difference between the delay clock signal and the corrected data strobe signal and generate a phase detection signal; and a shift register configured to generate the delay control signal in response to the phase detection signal.

Some exemplary aspects of the invention may provide a method of aligning data. The method may comprise detecting a phase difference between a clock signal and a data strobe signal, adjusting a delay time of the data strobe signal based on the detected phase difference to generate a corrected data strobe signal, delaying data by a time substantially equal to the delay time of the data strobe signal to generate corrected data, and latching the corrected data in response to the corrected data strobe signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
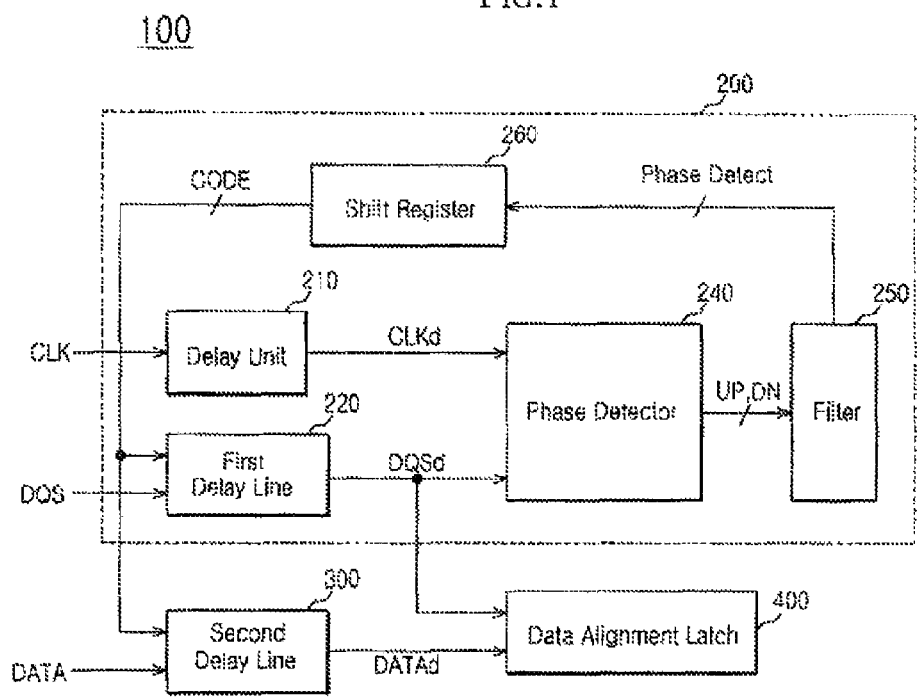
FIG. 1 is a block diagram of a data alignment circuit according to one exemplary embodiment of the invention.

Reference will now be made in detail to the exemplary embodiments consistent with the present disclosure, examples of which are illustrated in the accompanying drawings. Wherever possible, the same reference characters will be used throughout the drawings to refer to the same or like parts.

Referring to FIG. 1, a data alignment circuit 100 according to one exemplary embodiment of the invention may include a phase correction circuit 200, a second delay line 300, and a data alignment latch 400.

The phase correction circuit 200 is configured to detect a phase difference between a clock signal CLK and a data strobe signal DQS and adjust the delay time of the data strobe signal DQS according to the detection results. The phase correction circuit 200 is also configured to generate a corrected data strobe signal DQSd.

The phase correction circuit 200 includes a delay unit 210, a first delay line 220, a phase detector 240, a filter 250, and a shift register 260.

The delay unit 210 is configured to delay the clock signal CLK by a predetermined delay time and generate a delay clock signal CLKd.

The first delay line 220 is configured to delay the data strobe signal DQS by a predetermined delay time in response to a delay control signal CODE and generate the corrected data strobe signal DQSd.

The first delay line 220 may be implemented using binary weighting. For example, the first delay line 220 may comprise a plurality of unit delays to have sequentially increasing or decreasing delay time. The first delay line 220 may then be configured to select one of the unit delays using the delay control signal CODE composed of a plurality of bits to increase or decrease the delay time.

At this time, the initial delay of the first delay line 220 may be set to have substantially the same value as the delay time prescribed in the delay unit 210 according to the delay control signal CODE.

The phase detector 240 is configured to detect a phase difference between the delay clock signal CLKd and the corrected data strobe signal DQSd and generate a phase detection signal UP and/or DN.

The filter 250 is configured to output the phase detection signal UP and/or DN after removing noise included in the phase detection signal UP and/or DN. In some exemplary embodiments, the filter 250 may include a low pass filter to remove high frequency noise.

The shift register 260 is configured to generate the delay control signal CODE in response to the phase detection signal UP and/or DN from which noise has been removed through the filter 250.

The shift register 260 is configured to shift a bit having a value of '1' (out of a plurality of bits of the delay control signal CODE) leftward or rightward in response to the phase detection signal UP and/or DN.

The second delay line 300 is configured to delay data DATA by a predetermined delay time (e.g., a time substantially equal to the delay time of the data strobe signal DQS) in response to the delay control signal CODE and generate corrected data DATAd.

In various exemplary embodiments, the second delay line 300 may have the same configuration as that of the first delay line 220.

The data alignment latch 400 is configured to perform data alignment by latching the corrected data DATAd according to the corrected data strobe signal DQSd.

An exemplary operation of a data alignment circuit having the above-described configuration will be described below.

The delay unit 210 delays the clock signal CLK by the predetermined delay time and outputs the delay clock signal CLKd.

The first delay line 220 delays the data strobe signal DQS by the delay time predetermined according to the delay control signal CODE in the initial operation (e.g., the delay time set to the delay unit 210) and outputs the corrected data strobe signal DQSd.

The phase detector 240 detects the phase difference between the delay clock signal CLKd and the corrected data strobe signal DQSd and outputs the phase detection signal UP and/or DN.

Figure 2A:
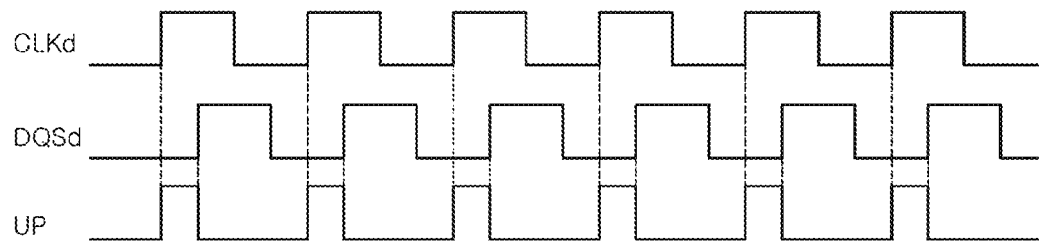
FIGS. 2A to 2C are timing diagrams explaining exemplary operations of the phase detector and the filter illustrated in FIG. 1.
Figure 2B:
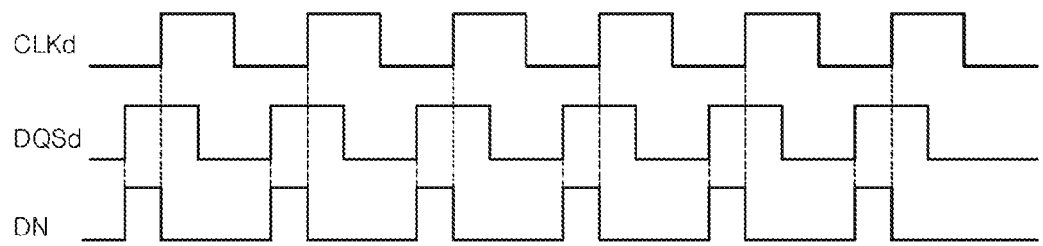

For example, as illustrated in FIG. 2A, when the phase of the delay clock signal CLKd is advanced ahead of the phase of the corrected data strobe signal DQSd, the phase detector 240 outputs phase detection signal UP. On the other hand, referring to FIG. 2B, when the phase of the corrected data strobe signal DQSd is advanced ahead of the phase of the delay clock signal CLKd, the phase detector 240 outputs phase detection signal DN.

Figure 2C:
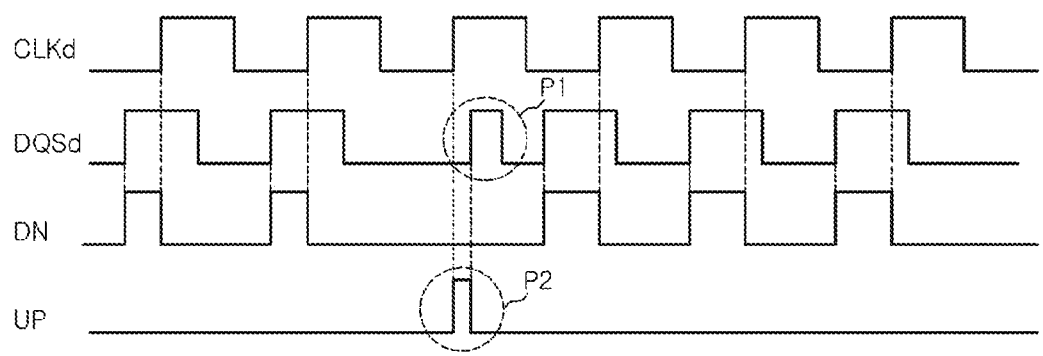

Thus, when the phase of the corrected data strobe signal DQSd is advanced ahead of the phase of the delay clock signal CLKd, the phase detection signal UP should not be generated. However, as shown in FIG. 2C, a pulse P1 caused by high frequency noise may be generated and, as a result, a pulse P2 may be generated as phase detection signal UP. In this regard, according to various exemplary embodiments of the invention, such noise is removed by the filter 250 and only the phase detection signal DN is provided to the shift register 260.

In response to the phase detection signal UP and/or DN, the shift register 260 shifts a bit with a value of '1' of the delay control signal CODE leftward or rightward.

The first delay line 220 increases or decreases the delay of the data strobe signal DQS in response to the delay control signal CODE.

Meanwhile, the second delay line 300 also increases or decreases the delay of the data DATA by a value substantially equal to the delay value in the first delay line 220 in response to the delay control signal CODE.

Figure 3:
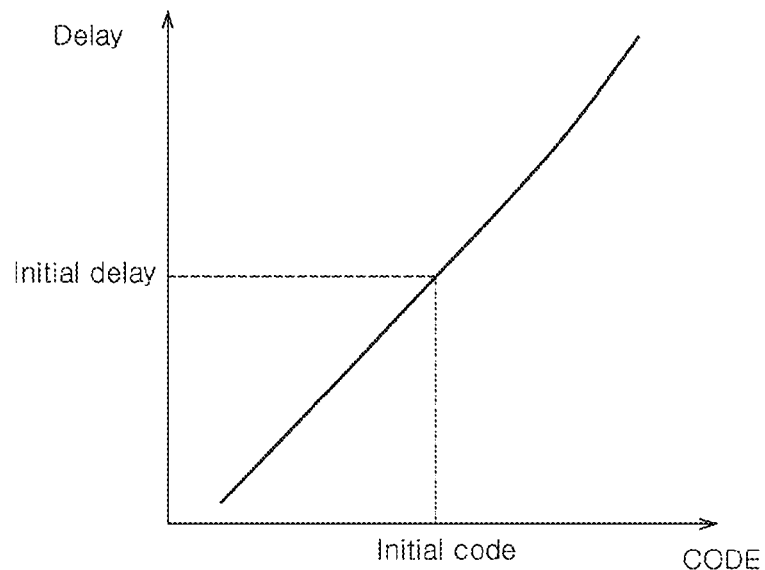
FIG. 3 is a graph illustrating a variation in the delay time of the first delay line and the second delay line illustrated in FIG. 1, according to some exemplary embodiments.

Consequently, as illustrated in FIG. 3, the clock signal CLK, the data strobe signal DQS, and the data DATA are delayed by the substantially same delay time according to the initial delay control signal CODE. Thus, the delay time of the data strobe signal DQS and the data DATA increases or decreases at substantially the same level where the delay time of the clock signal CLK is fixed.

Figure 4:
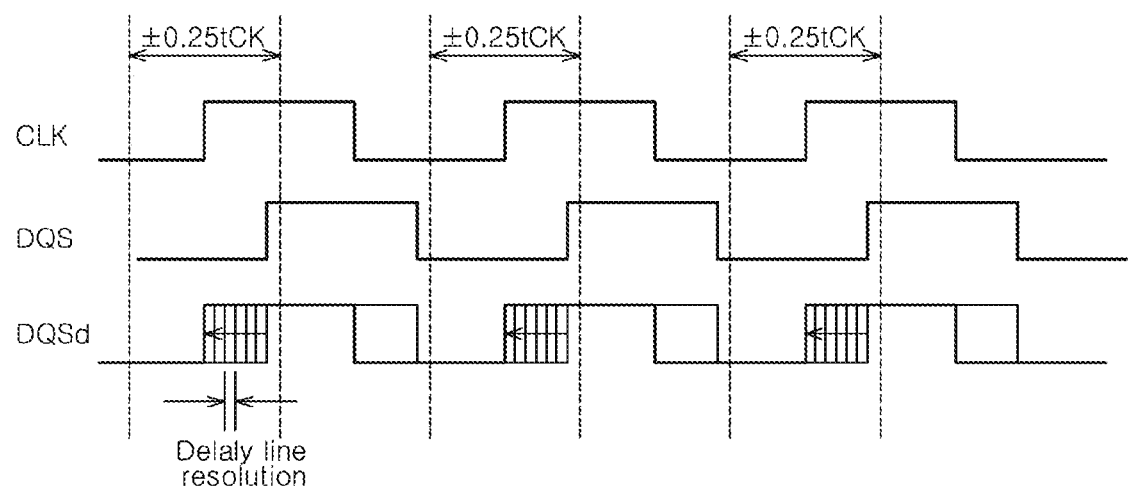
FIG. 4 is a timing diagram explaining an exemplary phase correction operation according to some exemplary embodiments.

Through the above-described processes, as illustrated in FIG. 4, the phase difference between the delay clock signal CLKd and the corrected data strobe signal DQSd can be adjusted to a level that satisfies the tDQSS specification.

Although not shown in the drawings, it may be possible to initialize the operation of at least one of the phase detector 240 and the shift register 260 by a periodic reset signal.

The phase correction circuit and the data alignment circuit using the same, according to various exemplary embodiments of the invention, can compensate for the skew of a clock signal CLK and a data strobe signal DQS in real-time, thereby improving data alignment performance and write operation performance.

While certain embodiments have been described above, it will be understood to those skilled in the art that the embodiments described are by way of example only. Accordingly, the phase correction circuit and the data alignment circuit using the same described herein should not be limited based on the described embodiments. Rather, the phase correction circuit and the data alignment circuit using the same described herein should only be limited in light of the claims that follow when taken in conjunction with the above description and accompanying drawings.

What is claimed is:

1. A phase correction circuit comprising:
a delay unit configured to delay a clock signal by a predetermined delay time and generate a delay clock signal;
a delay line configured to delay a data strobe signal by a variable delay time in response to a delay control signal and generate a corrected data strobe signal;
a phase detector configured to detect a phase difference between the delay clock signal and the corrected data strobe signal and generate a phase detection signal;
a shift register configured to generate the delay control signal in response to a filtered phase detection signal; and
a low pass filter configured to remove high frequency noise from the phase detection signal and output the filtered phase detection signal.

2. The phase correction circuit according to claim 1, wherein the delay line comprises a circuit configured to use binary weighting.

3. The phase correction circuit according to claim 1, wherein the initial value of the variable delay time of the delay line is set to be substantially equal to the predetermined delay time of the delay unit.

4. The phase correction circuit according to claim 1, wherein the data strobe signal is for a data write operation.

5. The phase correction circuit according to claim 1, wherein the delay line comprises a plurality of unit delays to sequentially increase or decrease the variable delay time.

6. The phase correction circuit according to claim 5, wherein the delay line is configured to select one of the unit delays based on the delay control signal to increase or decrease the variable delay time.

7. A data alignment circuit comprising:
a phase correction circuit configured to detect a phase difference between a clock signal and a data strobe signal, adjust a delay time of the data strobe signal based on the detected phase difference, and generate a corrected data strobe signal;
a delay line configured to delay data by a time substantially equal to the delay time of the data strobe signal and generate corrected data; and
a data alignment latch configured to latch the corrected data in response to the corrected data strobe signal.

8. The data alignment circuit according to claim 7, wherein the delay line comprises a circuit configured to use binary weighting.

9. The data alignment circuit according to claim 7, wherein the phase correction circuit comprises:
a delay unit configured to delay the clock signal by a first predetermined delay time and generate a delay clock signal;
a second delay line configured to delay the data strobe signal by a second predetermined delay time in response to a delay control signal and generate the corrected data strobe signal;
a phase detector configured to detect a phase difference between the delay clock signal and the corrected data strobe signal and generate a phase detection signal; and
a shift register configured to generate the delay control signal in response to the phase detection signal.

10. The data alignment circuit according to claim 9, further comprising a low pass filter configured to remove high frequency noise from the phase detection signal and output the filtered phase detection signal.

11. The data alignment circuit according to claim 9, wherein the second delay line comprises a circuit configured to use binary weighting.

12. The data alignment circuit according to claim 9, wherein the second predetermined delay time is variable in response to the delay control signal.

13. The data alignment circuit according to claim 9, wherein the initial value of the second predetermined delay time is set to be substantially equal to the first predetermined delay time.

14. A method of aligning data, comprising:
detecting a phase difference between a clock signal and a data strobe signal;
adjusting a delay time of the data strobe signal based on the detected phase difference to generate a corrected data strobe signal;
delaying data by a time substantially equal to the delay time of the data strobe signal to generate corrected data; and
latching the corrected data in response to the corrected data strobe signal.

15. The method of claim 14, wherein adjusting the delay time comprises delaying the data strobe signal by a variable delay time in response to a delay control signal.

16. The method of claim 15, further comprising generating the delay control signal based on the detected phase difference.

17. The method of claim 16, wherein generating the delay control signal comprises filtering the detected phase difference to remove noise.

18. The method of claim 14, wherein adjusting the delay time comprises binary weighting.

* * * * *